United States Patent [19]

Lin

[11] Patent Number: 5,898,703
[45] Date of Patent: Apr. 27, 1999

[54] DEVICE AND METHOD FOR TESTING INTEGRATED CIRCUIT INCLUDING BI-DIRECTIONAL TEST PIN FOR RECEIVING CONTROL DATA AND OUTPUTTING OBSERVATION DATA

[75] Inventor: Richard Lin, Tokyo, Japan

[73] Assignee: Mitsubishi Denki Kabushiki Kaisha, Tokyo, Japan

[21] Appl. No.: 08/976,572

[22] Filed: Nov. 24, 1997

[30] Foreign Application Priority Data

Jun. 5, 1997 [JP] Japan .................................. 9-148331

[51] Int. Cl.[6] .................................................. G01R 31/28
[52] U.S. Cl. ...................... 371/22.31; 371/22.1; 371/22.5
[58] Field of Search ............................. 371/22.31, 22.33, 371/22.1, 22.5, 22.6; 324/158 R

[56] References Cited

U.S. PATENT DOCUMENTS

| | | | |
|---|---|---|---|
| 4,656,632 | 4/1987 | Jackson | 371/25.1 |
| 4,687,989 | 8/1987 | Davis et al. | 324/758 R |
| 5,146,161 | 9/1992 | Kiser | 324/158 R |
| 5,404,358 | 4/1995 | Russell | 371/22.3 |
| 5,513,186 | 4/1996 | Levitt | 371/22.3 |
| 5,557,236 | 9/1996 | Monti | 327/565 |

FOREIGN PATENT DOCUMENTS

59-175133  10/1984  Japan .

*Primary Examiner*—Hoa T. Nguyen
*Attorney, Agent, or Firm*—Leydig, Voit & Mayer

[57] ABSTRACT

The present invention includes a main circuit and a circuit to be tested. An observation node and a control node are connected to the circuit to be tested. A pin is connected via an analog switch and a digital switch to these nodes. The test circuit controls the switch and input and output of test data. The test circuit has one bi-directional digital pin. A control signal and observation data are input to and output from an analog circuit through an analog test pin.

5 Claims, 9 Drawing Sheets

| In0 | In1 | Control | Out |
|-----|-----|---------|-----|
| 0   | DC  | 0       | 0   |
| 1   | DC  | 0       | 1   |
| DC  | 0   | 1       | 0   |
| DC  | 1   | 1       | 1   |

| TEST COMMAND NAME | CODE | BASIC OPERATIONS EXECUTED IN TEST COMMAND |
|---|---|---|
| SET SWITCHES FOR D/A CONVERTER TEST | 0000 | SET THE TEST SWITCHES TO THE FOLLOWING STATE SO THAT THE D/A CONVERTER TEST CAN BE EXECUTED : <br> ANALOG SWITCH 613→b <br> ANALOG SWITCH 610→a <br> DIGITAL SWITCH 611→b <br> DIGITAL SWITCH 612→a |
| SET SWITCHES FOR A/D CONVERTER TEST | 0001 | SET THE TEST SWITCHES TO THE FOLLOWING STATE SO THAT THE A/D CONVERTER TEST CAN BE EXECUTED : <br> ANALOG SWITCH 613→a <br> ANALOG SWITCH 610→b <br> DIGITAL SWITCH 611→a <br> DIGITAL SWITCH 612→a |
| SET SWITCHES FOR LOGIC CIRCUIT BLOCK TEST | 0010 | SET THE TEST SWITCHES TO THE FOLLOWING STATE SO THAT THE LOGIC CIRCUIT BLOCK TEST CAN BE EXECUTED : <br> ANALOG SWITCH 613→a <br> ANALOG SWITCH 610→a <br> DIGITAL SWITCH 611→a <br> DIGITAL SWITCH 612→b |
| SET SWITCHES FOR NORMAL OPERATION | 0011 | SET THE TEST SWITCHES TO THE FOLLOWING STATE SO THAT THE MAIN CIRCUIT CAN PERFORM ITS NORMAL OPERATION : <br> ANALOG SWITCH 613→a <br> ANALOG SWITCH 610→a <br> DIGITAL SWITCH 611→a <br> DIGITAL SWITCH 612→a |
| RESET MAIN CIRCUIT | 0100 | RESET MAIN CIRCUIT |
| DATA INPUT TO REGISTER 616 | 0101 | DATA ON THE BI-DIRECTIONAL DIGITAL TEST PIN 604 IS INPUTTED TO THE REGISTER 616 IN THE CLOCK CYCLE AFTER THE TEST COMMAND CODE IS ENTERED |
| DATA INPUT TO REGISTER 617 | 0110 | 8 BIT SERIAL DATA ON THE BI-DIRECTIONL DIGITAL TEST PIN 604 IS INPUTTED TO THE REGISTER 617 IN THE 8 CLOCK CYCLES AFTER THE TEST COMMAND CODE IS ENTERED |
| DATA OUTPUT FROM REGISTER 618 | 0111 | DATA IN THE REGISTER 618 IS OUTPUTTED TO THE BI-DIRECTIONAL DIGITAL TEST PIN 604 IN 8 BIT CYCLES AFTER THE TEST COMMAND CODE IS ENTERED |

DEVICE AND METHOD FOR TESTING INTEGRATED CIRCUIT INCLUDING BI-DIRECTIONAL TEST PIN FOR RECEIVING CONTROL DATA AND OUTPUTTING OBSERVATION DATA

BACKGROUND OF THE INVENTION

1. Field of the Invention

The present invention relates to an integrated circuit device and a testing method thereof. Specifically, the invention relates to an integrated circuit device having a digital and/or analog circuit parts and a testing circuit for executing the testing of the digital circuit part and the analog circuit part, and relates to the testing method thereof.

2. Description of the Prior Art

As integrated circuits become more dense and complex, it has become increasingly important to test circuits after they have been manufactured to guarantee quality and correctness. The increase in density and complexity has also made the physical availability of pins on a microchip a problem, and it has become important to design circuits which have the reduced number of external pins used.

Although various circuit specific methods have been developed for testing digital circuits of integrated circuit devices, most modern designs employ the scan testing method. This method usually employs four or more external testing pins including a pin to select the mode of scan flip-flop circuits in the digital circuit parts to be tested in a scanning mode or a normal operation mode, an input pin for inputting control data, an output pin for outputting observation data, and a clock pin for inputting a clock signal. In addition, this scan testing method is not suited to test circuits with analog control or observation nodes.

Since the conventional integrated circuit device and its testing method are constructed as above, plural external testing pins may be required for the integrated circuit device, whereby there are problems in which the size of the integrated circuit device cannot be minimized as well as the analog circuit parts cannot be tested suitably.

SUMMARY OF THE INVENTION

As compared with conventional circuit test devices and methods, the present invention suggest to suggest an integrated circuit device and a test method for reducing the number of test pins necessary to test digital circuit parts to one pin, and for testing analog circuit parts.

To achieve the above-described objects, according to a first aspect of the present invention, there can be provided an integrated circuit device comprising only one bi-directional digital test pin for exchanging control data and observation data with an outside tester. Accordingly, there can be obtained an advantage that the number of the test pins can be minimized.

According to a second aspect of the invention, there can be provided an integrated circuit device comprising a main circuit including an analog circuit part for carrying out an analog signal process, a test circuit transferring also control data for a performance test of the analog circuit part, one bi-directional digital test pin for exchanging control data and observation data of a digital circuit part of the main circuit with a tester, and an analog test pin for exchanging control data and observation data of the analog circuit part with the tester. Accordingly, there can be obtained an advantage that a test for the analog circuit part can also be carried out.

According to a third aspect of the invention, there can be provided an integrated circuit device comprising only one test pin for using as both a digital signal and an analog signal to exchange control data and observation data with an outside tester. Accordingly, there can be obtained an advantage that a test for a digital circuit part and an analog circuit part of the integrated circuit device can be carried out with the minimum number of test pins.

According to a fourth aspect of the invention, there can be provided a test method of an integrated circuit device comprising the steps of switching a switch into a performance test state, transferring control data serially to a test circuit from one test pin, and outputting observation data to an outside tester via the test pin from the test circuit. Accordingly, there can be obtained an advantage that a test can be carried out with the minimum number of test pins.

According to a fifth aspect of the invention, there can be provided a test method of an integrated circuit device comprising the steps of switching a switch into a performance test state, transferring control data to a test circuit from an analog test pin, and outputting observation data to an outside tester via the analog test pin from the test circuit. Accordingly, an advantage can be obtained that a test of the integrated circuit device can be carried out by using an analog test pin.

BRIEF DESCRIPTION OF THE DRAWINGS

The above and further objects and novel features of the invention will more fully appear from the following detailed description when the same is read in connection with the accompanying drawings.

FIG. 4(1) and FIG. 4(2) are a circuit diagram showing a digital switch according to the first embodiment and a truth table thereof respectively.

DETAILED DESCRIPTION OF THE PREFERRED EMBODIMENT

Preferred embodiments of the invention will now be described referring to the accompanying drawings.

EMBODIMENT 1

First, a description will be given of an integrated circuit device according to a first embodiment (Embodiment 1) of the present invention. Embodiment 1 is a microchip having a main circuit which requires testing a test circuit for testing this main circuit, and other circuits for which testing is not required. The main circuit includes one or more modules which can be tested separately or in groups by the test circuit when analog switches and digital switches are inserted into an observation node and a control node. The test circuit is composed of a sequential circuit, shift registers, a bi-directional digital test pin, and an analog pin. The microchip including this integrated circuit device has at least one clock signal inputted through the testing external pin for the integrated circuit device which is driven by this clock signal.

Figure 1:
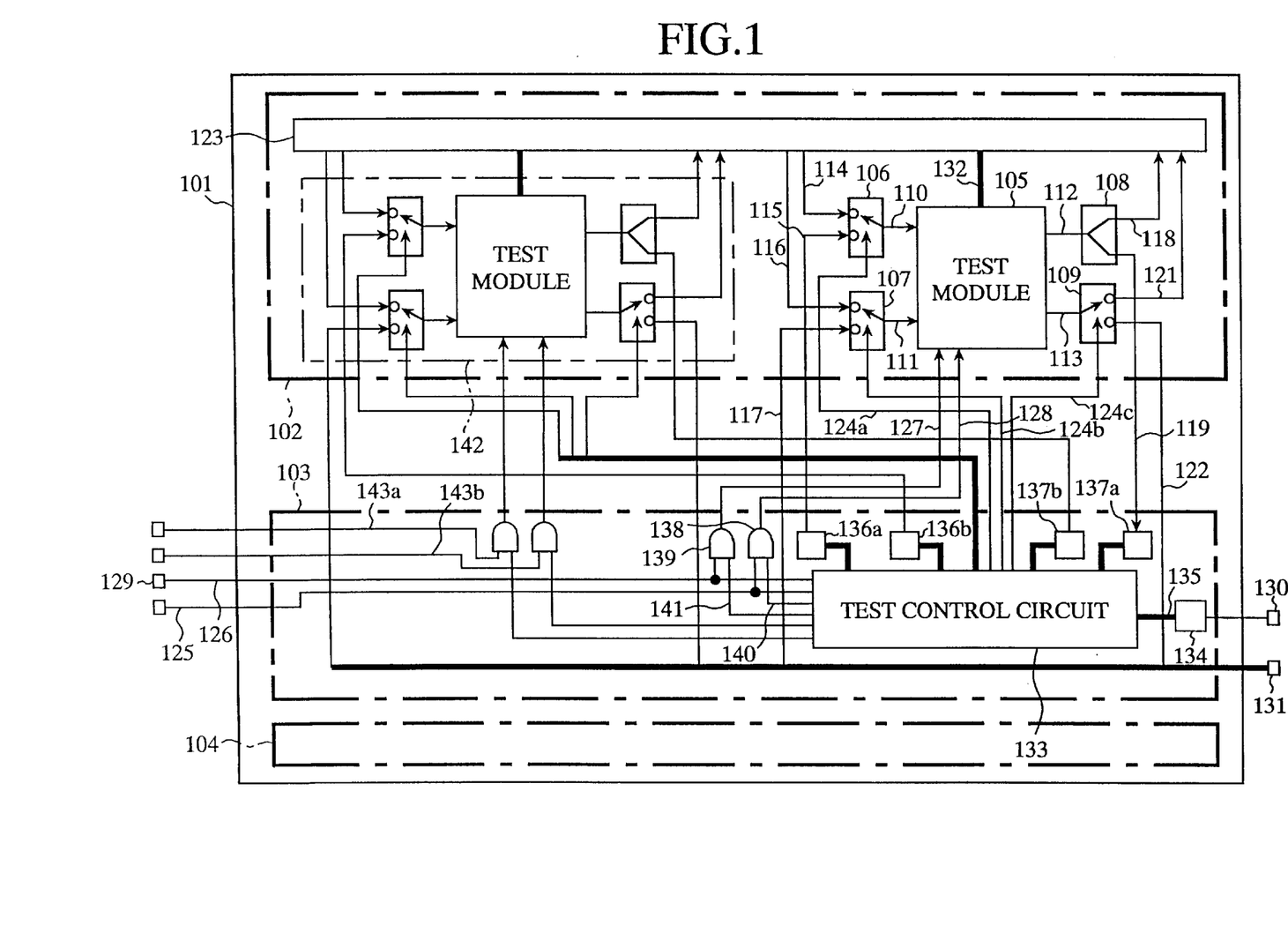
FIG. 1 is a structural diagram showing an integrated circuit of a first embodiment of the present invention.

FIG. 1 describes a structural diagram showing the integrated circuit device of the first embodiment. In the figure, thin lines represent one signal wire line and thick lines represent a group of one or more signal wire lines.

In FIG. 1, reference numeral 101 denotes the integrated circuit device, 102 denotes the main circuit, 103 illustrates the test circuit, and 104 shows other circuits not involved in the test.

Further, reference numeral 105 shows one of possibly several modules to be tested within the main circuit 102, 110 denotes a digital control node inputting a digital control signal for controlling the test module 105, 111 illustrates an analog control node inputting an analog control signal for controlling the test module 105, 112 shows a digital observation node outputting digital observation data from the test module 105, and 113 shows an analog observation node outputting analog observation data from the test module 105.

Moreover, reference numeral 123 represents other circuits including modules to be tested and switches, 131 indicates analog test pins which may be used for input and output of analog control data and observation data, 114 denotes a signal line for transferring common digital data from the other circuits 123 to the digital control node 110, 115 illustrates a signal line for transferring a digital testing signal from the test circuit 103 to the digital control node 110, 116 represents a signal line for transferring common analog data from the other circuits 123 to the analog control node 111, 117 indicates a signal line for transferring the control data from the analog test pins 131 to the analog control node 111, 118 shows a signal line for transferring the digital observation data of the test module 105 to the other circuits 123, 119 illustrates a signal line for transferring the digital observation data from the test module 105 to the test circuit 103, 121 denotes a signal line for transferring analog observation data of the test module 105 to the other circuits 123, 122 indicates a signal line for transferring analog observation data of the test module 105 to the analog test pins 131, 106 denotes a digital switch (switch) for switching the common digital data from the signal line 114 and the test signal from the signal line 115 to output to the digital control node 110, 107 shows an analog switch for switching the common analog data from the signal line 116 and the control data from the signal line 117 to output to the analog control node, 108 illustrates a connection part for outputting digital observation data from the digital observation node 112 to the signal lines 118 and 119, 109 shows an analog switch for switching the analog observation data on the analog observation node 113 to output to the signal line 121 or the signal line 122, 132 represents signal lines for observing between the test module 105 and the other circuits 123 or transferring the common data which is not control data, 142 denotes a circuit including other test module and related switches.

In addition, a reference numeral 133 illustrates a test control circuit which includes sequential circuit executing test commands, 124a shows a signal line for transferring a switching signal of the switch 106 outputted from the test control circuit 133, 124b represents a signal line for transferring a switching signal of the switch 107 outputted from the test control circuit 133, 124c indicates a signal line for transferring a switching signal of the switch 109 outputted from the test control circuit 133, 126 denotes a signal line for transferring the clock signal to the test control circuit 133, 125 illustrates a signal line for transferring a reset signal to the test control circuit 133, 129 shows an external pin for inputting the clock signal to the integrated circuit device 101, 130 represents a bi-directional digital test pin for inputting and outputting digital data and control data, 134 indicates a bi-directional buffer circuit, 135 denotes a signal line connecting between a buffer circuit 134 and the test control circuit 133, 136a illustrates a register which holds digital control signals for the test module 105, 136b shows a register which holds digital control signals for the other test module in the circuit 142, 137a represents a register which holds digital observation data from the test module 105, 137b indicates a register which holds observation data from the other test module in the circuit 142, 140 denotes a signal line for transferring a set signal or a reset signal for the test module 105 from the test control circuit 133, 141 illustrates a signal line for transferring a clock stop signal for the test module 105 from the test control circuit 133, 138 shows an AND circuit which inputs the reset signal on the signal line 125 and the reset signal on the signal line 140, 139 represents an AND circuit which inputs the clock signal on the signal line 126 and the clock stop signal on the signal line 141, and the test module 105 stops the reset and clock signal respectively when the outputs of the AND circuits 138 and 139 are low level. The reset signal and the clock stop signal assume high level generally, and assume low level only when resetting and stopping the clock. Reference numeral 128 denotes a signal line for transferring the output signal from the AND circuit 138 to the test module 105, 127 illustrates a signal line for transferring the output signal from the AND circuit 139 to the test module 105, 143a shows a signal line for transferring the clock signal to the other test module in the circuit 142, 143b represents a signal line for transferring the reset signal to the other test module in the circuit 142. Here, the control data includes control commands required for the control.

Figure 2:
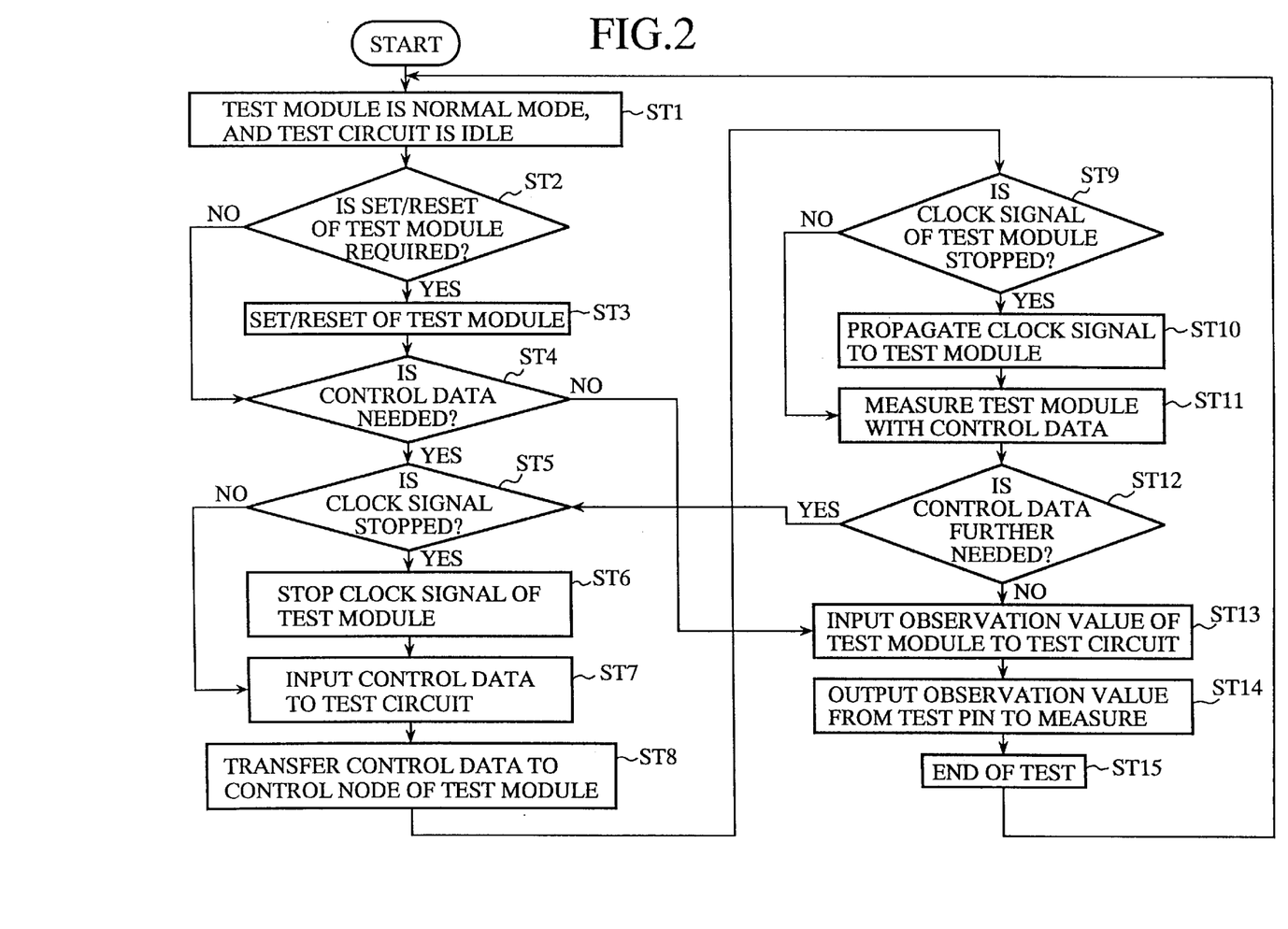
FIG. 2 is a flowchart showing operations of the first embodiment.

Next, the operation will be described referring with the flowchart of FIG. 2.

First, this integrated circuit operates normally, the test module is also in normal state, the test circuit 103 is in stop state (step ST1).

In order to test the test module 105, it is decided whether a set (condition setting for making the test possible) or a reset is required or not (step ST2), and if necessary, the test module 105 is set or reset (step ST3).

Subsequently, since some tests may not require control data, it is decided whether the test to be executed requires control data or not (step ST4).

If the control data is required, since there is a case that the clock signal in the main circuit 102 is stopped and that the continuous control data has to be inputted in accordance with the type of the test module 105 after a predetermined clock cycle is transmitted into the main circuit 102, then it is decided whether the clock signal is required to stop or not (step ST5).

If the clock signal is required to stop, the test circuit 103 outputs the clock stop signal to the signal line 141, and stops the input of the clock signal for the main circuit 102 (step ST6). After this, desired data is inputted from the bi-directional test pin 130 and/or the analog test pins 131 to the test circuit 103 (step ST7). In addition, if the clock signal is not required to stop, the process proceeds immediately to the step (step ST7) to input the control data when it is decided that the control data is required at the step ST4.

In the inputted data, the digital control data is transferred to the test module 105 through the buffer circuit 134, the signal lines 135, the test control circuit 133, the register 136a, the signal line 115, the switch 106, and the digital control node 110, and the analog control data is transferred to the test module 105 through the signal line 117, the switch 107, and the analog control node 111 (step ST8).

Next, in the step ST5, it is decided whether the stop of the supply for the clock signal to the test module 105 was executed or not (step ST9), and if the clock signal is stopped, the supply of the clock signal to the test module 105 is restarted (step ST10).

Thus the test is ready to be performed, and the circuit in the test module 105 is tested in accordance with the inputted data (step ST11). The time required for this test varies depending on the structure of the test module 105, but is known in advance, so that the observation values representing the result of the test can be sampled at the proper time.

Depending on the structure of the test module 105, the steps ST5 to ST11 may have to be repeated after the test is completed in accordance with the control data, so that it is decided whether the control data is further required or not (step ST12) subsequently, and if the control data is required, the repetition is performed of the decision whether to stop the clock or not (step 5), stopping the clock in the case that the stop is needed (step ST6), the control data input for the test circuit 103 (step ST7), the transferring to the test module 105 (step ST8), the decision whether the clock signal stop was executed or not (step ST9), the restart of the clock if stopped (step ST10), and the test of the test module 105 (step ST11).

When the observation values are ready to be sampled, digital observation values are outputted to the test circuit 103 by clocking the value at the observation nodes 112, while analog observation values are inputted into the test circuit 103 through the analog switch 109 (step ST13). Finally, the observation values are outputted from the bi-directional digital test pin 130 and/or analog test pins 131 to measure by a tester which is not shown (step ST14). Consequently, the test is completed (step ST15).

Figure 3:
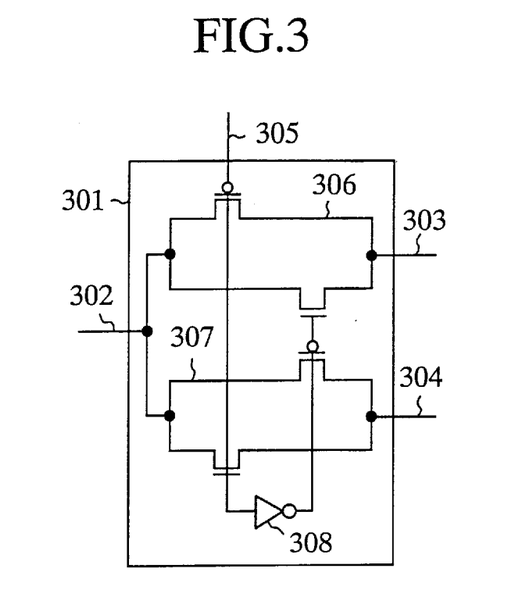
FIG. 3 is a circuit diagram showing an analog switch according to the first embodiment.
Figure 4:
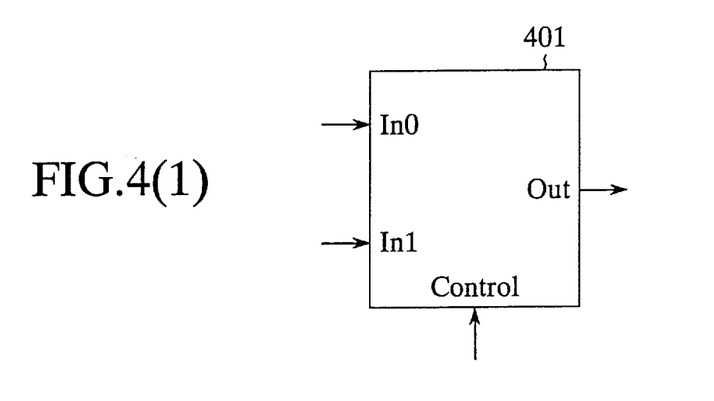

In addition, the analog signal may have to be switched in the case that the test using the analog signal is carried out in the above-mentioned testing, and the analog switches 107 and 109 are used for this switching, in the first embodiment. FIG. 3 is a circuit diagram showing the structure of the analog switches 107 and 109. In the figure, a reference numeral 301 denotes analog switches, 302 to 304 illustrate terminals, 305 shows a switching signal input terminal, 306 and 307 represent transfer gates, and 308 indicates an inverter.

Next, the operation will be described for the analog switch.

In the case that the switching signal applied to the switching signal input terminal 305 is a low level signal, the transfer gate 306 turns on, and the transfer gate 307 turns off, so that the terminal 302 becomes an electrical short with the terminal 303. When the switching signal is a high level signal, the transfer gate 306 turns off, and the transfer gate 307 turns on, so that an electrical short exists between the terminal 302 and the terminal 304. Thus, the analog switch 301 is the bi-directional, and can also be used as an input switch as the switch 107 or an output switch as the switch 109.

Furthermore, the digital switch may have to be switched in the case that the test is performed using the digital signal, and the digital switch 106 is used for this switching, in the first embodiment. FIG. 4(1) is a circuit diagram and FIG. 4(2) is a and its truth table of this digital switch 106. In FIG. 4(1), reference numeral 401 denotes a logic cell forming the switch 106, In0 and In1 illustrate input terminals for switching the input signal, Out shows an output terminal, and Control represents an input terminal for the switching control signal. As shown in the truth table of FIG. 4(2), the logic cell 401 outputs the same signal level as the signal which is inputted into the input terminal In0 to the output terminal Out when the low level signal (logic value "0") is inputted into the input terminal Control, and outputs the same signal level as the signal which is inputted into the input terminal In1 to the output terminal Out when the high level signal (logic value "1") is inputted into the input terminal Control. In other words, the input for the input terminal In0 is selected by the low level control signal, and the input for the input terminal In1 is selected by the high level control signal. Note that "DC", i.e., don't care in the truth table means it does not interfere with the output value even if the input at the corresponding column assumes a logic value "0" or "1". In addition, in the first embodiment, the digital switch is not required, because the observation node 112 is directly connected to the signal line 109 via the connection part 108, so that the sampling can be carried out from the register 137a when required. Moreover, in the case that there is only one analog observation node 113, the analog output switch 109 can be shorted to the connection part 108.

The integrated circuit device 101 of the first embodiment is tested using the bi-directional digital test pin 130 or the analog test pins 131, in accordance with the control signal from the tester. The test signal from the tester is inputted into the integrated circuit device 101 from the bi-directional digital test pin 130, and is inputted into the test control circuit 133 via the buffer circuit 134 and the signal line 135. The test control circuit 133 processes the control signal and data between the test circuit 103 and the main circuit 102 in accordance with an inputted binary test command code. When the main circuit 102 operates normally and the test circuit 103 stops the operation, the bi-directional digital test pin 130 will be always function as an input pin. The tester will input a first logic value ("0" or "1") which will keep the test circuit 103 idle, and which will command a state that it does not interfere with the normal operation of the main circuit 102, when the digital switch 106, the analog switch 107 and analog switch 109 are switched to the side of the normal operation. Furthermore, a command having a predetermined number of bits starting from a second logic value (the opposite of the first logic value) is applied to the bi-directional digital pin 130, then the following basic operation of the test will be executed.

Depending on the tests to be carried out, the basic operation will generally consist of all or a subset of the following operations, i.e., operations to change the setting of the digital switch 106 and the analog switches 107 and 109; operations to input the digital control data; operations to output the digital observation data; operations to wait for a predetermined number of the clock cycles; operations to set or reset the test module 105; and operations to stop and start the clock signal of the test module 105.

The necessary bit length of a binary code to distinctly identify the test commands is the rounded-up value of the base 2 logarithm of the number of test commands. As descried above, the second logic value is attached to the command code such that the test control circuit 133 will know when to start treating the input signal for the bi-directional digital test pin 130 as a test command code. Once the test command code just after the above-mentioned second logic a value has been inputted, the test control circuit 133 executes the next basic operations which correspond to this command code.

If a basic operation to input digital control values has been selected, digital control data is clocked in order from the bi-directional digital test pin 130, and stored in the register 136a. The data stored in the register 136a is inputted into the test module 105 via the signal line 115, the switch 106 and the digital control node 110, and the test is executed. In the test, After the command code is inputted into the test control circuit 133 and is decoded by the test control circuit 133, and the control data having the predetermined bits is inputted into the test module 105 through the sequential digital control node 110 from the test control circuit 133, the control circuit 133 returns to an idle state until the inputting of the next test command.

In the case that the basic operation to output the digital observation data is selected, the test control circuit 133 latches the digital observation value outputted to the signal line 119 into the register 137a, and switches the bi-directional digital test pin 130 into the output side, as well as serially outputs the data latched in the register 137a from this bi-directional digital test pin 130. The output of the digital observation data is carried out by one bit, and after all observation data has been clocked out, the bi-directional digital test pin 130 returns to an input state, and the test control circuit 133 returns to the idle state until the next test command is entered therein.

The test control circuit 133 requires a clock signal as well as a reset signal to operate. The reset signal is necessary to put the test control circuit 133 in the idle state so that it can receive test commands. The reset signal also sets the switches so that the normal operation of the main circuit 102 can proceed. This Embodiment 1 suggests the use of the same reset and clock signal as another circuit on the semiconductor integrated circuit 101. These may be the same as that of the test module 105. Note that the resetting of the test control circuit 133 must be done before the main circuit 102 starts the normal operation, so that the test switches will be set for normal operation. The inputting of the control data and the outputting of the observation data does not depend on the operational frequency of the main circuit 102. However, in the case that the test control circuit 103 operates the stopping or driving for the clock signal of the test module 105, or if a test command specifies an operation that requires synchronization with the clock signal of the test module 105 (for instance, the test circuit 103 instructs an operation where the test circuit 103 must wait a certain number of cycles of the test module 105), a clock signal which permits these conditions must be chosen as the clock signal of the test circuit 103.

When functioning as an input pin, the bi-directional digital test pin 130 samples the data applied to the bi-directional digital test pin 130 synchronously with the clock signal of the test circuit 103. Therefore, transitions of the input signal must also be synchronous with the clock signal. In this integrated circuit device, since the clock signal is also used by other circuits, the external pin 129 will be used by the tester to synchronize the transition of the input signal and the sampling of the output signal on the bi-directional digital test pin 130.

Figure 5:
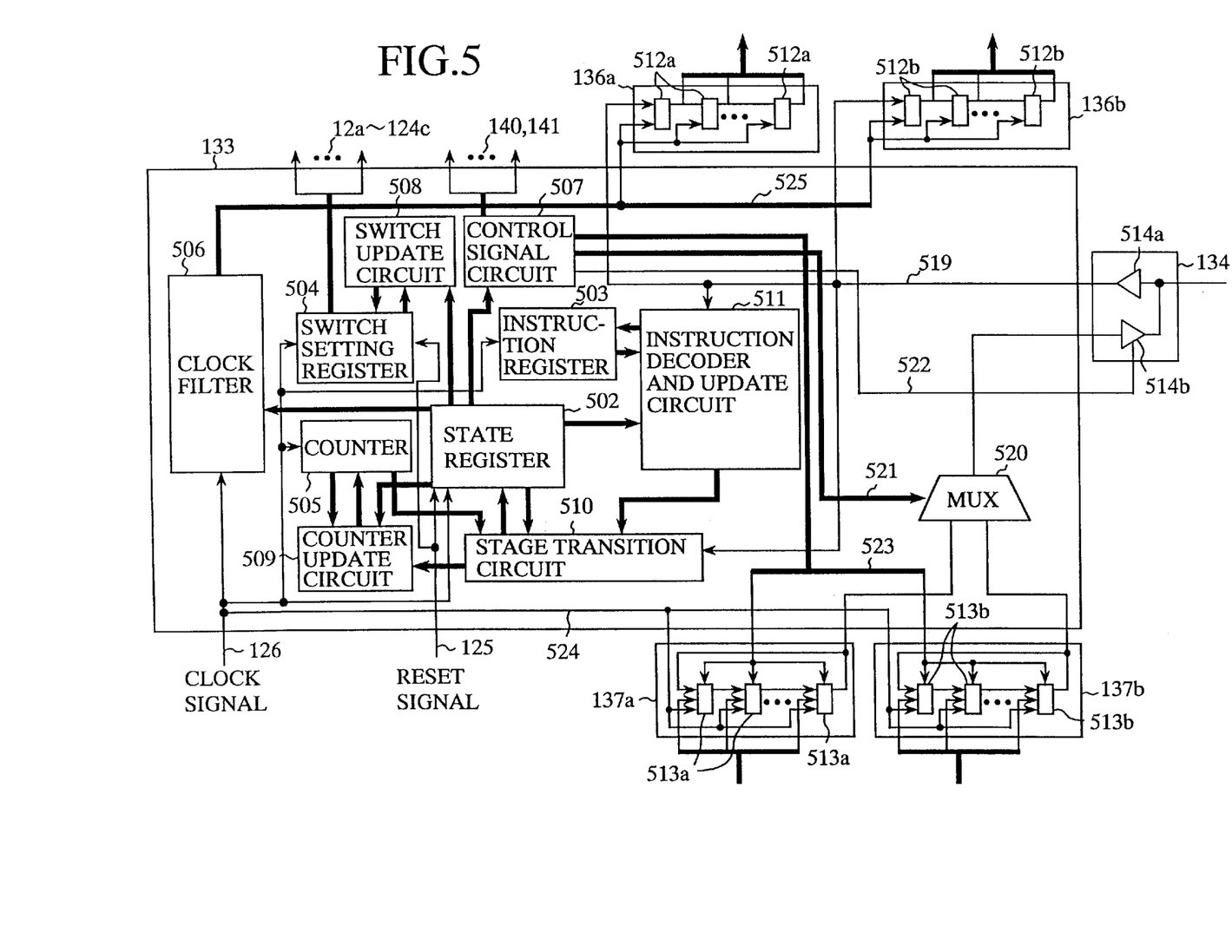
FIG. 5 is a block diagram showing a test circuit according to the first embodiment.

FIG. 5 is a block diagram showing the test circuit 130. In FIG. 5, reference numeral 502 denotes a state register for storing codes indicating the state of each operation or idle state of the test control circuit 133, 503 illustrates an instruction register for storing an instruct code in the test, 504 shows a switch setting register for storing the state of the control signal to control the operations of the switches 106, 107 and 109, and 505 represents a counter for counting the length of the instruction code for the test, so that these codes are respectively contained in a memory implemented by edge triggered flip-flops.

In addition, reference numeral 506 denotes a clock filter for generating a driving clock for a D-type flip-flop in accordance with the clock signal inputted from the outside via the signal line 126, 507 illustrates a control signal circuit for generating each of the control signals, 508 shows a switch update circuit for updating the value of the switch setting register 504, 509 represents a counter update circuit for updating the counted value of the counter 505, 510 indicates a state transition circuit for setting each of operational states in the test circuit 103, and 511 denotes an instruction decoder and an update circuit for decoding the instruction inputted from the outside and updating the data of the instruction register 503.

The registers 136a and 136b for latching the control data are realized by standard D-type flip-flops 512a and 512b, and the buffer circuit 134 is realized by a digital buffer circuit 514a and a state digital buffer circuit 514b.

Reference numeral 519 denotes a signal line for transferring the digital signal inputted from the buffer circuit 514a, 520 illustrates a multiplexer for selecting digital signal to be outputted to the buffer circuit 514b, 521 shows signal lines for transferring the control signal to control the selecting operations of the multiplexer 520, 522 represents a signal line for transferring the control signal to control the operations of the buffer circuit 514b, 523 indicates signal lines for transferring the control signal to control the operations of the registers 137a and the 137b, 524 denotes a signal line for transferring the clock signal to the registers 137a and 137b, 525 illustrates signal lines for the clock signal to drive the operations of the registers 136a and 136b.

Subsequently, the operations will be described. Here, since the basic operations of the test control circuit 133 have been described beforehand, only operations inhering in the circuit arrangement shown in FIG. 5 will be explained.

The register 502 which is updated through the state transition circuit 510 must be able to accommodate at least the following states, i.e., an idle state when the test control circuit 133 waits for a test command code from the bi-directional digital test pin 130; a test command reception state to read in the test command code; states to input the digital control data if the digital observation data is required in the test; states to output the digital control data if the digital observation data is required in the test; states to set the switches; states to set and reset the test module 105 if necessary; and states to turn on and off the clock signal for the test module 105 requiring the clock signal. The state register 502 may also have states to allow the test control circuit 133 to wait a specified number of clock cycles between the execution of successive basic operations.

The instruction register 503 requires enough memory elements to hold all the test instructions. That is, the necessary number of bits in the instruction register to distinctly identify the test commands is the rounded-up value of the base 2 logarithm. The instruction decoder and the update circuit 511 transfer the data on the signal line 519 into the instruction register 503 when the state register 502 is in the test command reception state. The instruction decoder and the update circuit 511 include a decoder, and the decoder identifies and instructs to the state transition circuit 510 which test command has been inputted into the instruction register 503.

The switch setting register 504 includes one memory element for each switch to be used in testing. The switches 106, 107 and 109 are controlled by the data stored in these memory elements. The data of the switch setting register 504 is updated by the switch update circuit 508, and the current switch state is held in the switch update circuit 508 along with the data of the state register 502. Further, the output state of the switch setting register 504 is determined by the output from the switch update circuit 508. After the test control circuit 133 is reset, the switch setting register 504 will take data having the state to set the test switches such that normal operations of the main circuit 102 can proceed.

The counter 505 is a register which is updated by the counter update circuit 509. The counter 505 must have enough bits to accommodate the following tasks. That is a task for counting the number of bits for the test command when the test command is read therein; a task for counting the number of bits for the inputted digital control data when executing a basic command to input the digital control data; a task for counting the number of bits for the digital observation data outputted when executing a basic command to output the digital observation data; and a task for counting waiting time between the execution of the basic operations when a test command includes several basic operations to be executed in sequence.

The control signal circuit 507 transfers the control signal of the multiplexer 520 via the signal lines 521, and instructs the switching of the buffer circuit 514b via the signal line 522, to output respectively the reset signal or set signal and the clock stop signal to the signal lines 140 and 141, thereby transferring the control signal via the signal lines 523 to the scan D-type flip-flops 513a and 513b. The control signal circuit 507 is implemented with combinational circuit and the memory element, and the data of the state register 502 is inputted.

The clock filter 506 is implemented with combinational circuit, and determines whether the D-type flip-flops 512a and 512b of the registers 136a and 136b are driven or not in accordance with the data inputted from the state register 512. The clock signal for driving the D-type flip-flops 512a and 512b is outputted through the signal lines 525.

After the test control circuit 133 is reset, the state register will be in the idle state. This causes the control signal circuit 507 output a control signal for switching the buffer circuit 514b into the input side via the signal line 522. When in the idle state, the state transition circuit 510 samples the data inputted from the bi-directional digital test pin 130 via the signal line 519 at each clock cycle and keeps the state register 502 in the idle state if the first logic value is detected, or the changes the state register 502 to the test command reception state if the second logic value is detected. When changing to the test command reception state, the counter 505 is set or reset by the counter update circuit 509 to count the length of the test command code. One bit of the test command code is shifted in on each clock cycle and once the counter has reached the correct number, the state transition circuit 510 uses the test command decoded by the instruction decoder and the update circuit 511 to change the state of the state register 502 appropriately so that the test command indicated by the inputted code can be executed.

If the test command specifies a basic command to input the digital control data, the counter 505 is set or reset by the counter update circuit 509, so that the correct number of control bits can be inputted into the registers 136a and 136b. While the state register 502 is in a state to input into the digital control data, the clock filter 506 outputs the clock signal onto the signal lines 525, so that the input data inputted via the signal line 519 will be transferred to the registers 136a and 136b selected by the basic command.

The clock signals may be continuously supplied to the main circuit 102, with sampling the registers 137a and 137b at each clock cycle during normal operation of the main circuit 102. When a test command specifies a basic command to output the digital observation data, the control signal circuit 507 makes the registers 137a and 137b active as the shift registers, to output contents held therein through the multiplexer 520, the buffer circuit 514b and the bi-directional digital test pin 130. The control signal circuit 507 also specifies, to the multiplexer 520 via the signal lines 521, which register data of the registers 137a and 137b is outputted. Note that the multiplexer 520 is not required when using only one register in the registers 137a and 137b. Once the counter 505 has counted the predetermined number of clock cycles, the state register 502 is updated to the idle state and the bi-directional digital test pin is again switched to the input mode by the control signal circuit 507, so that the next test command code can be entered.

The following will be describe an actual circuit arrangement of the first embodiment.

In the example of this actual circuit arrangement employs one analog test pin in addition to the bi-directional digital test pin. The reset signal operates with low logic, and each digital circuit operates with an edge of the clock signal. This example circuit arrangement does not require stopping the clock of the main circuit 102 during testing. The above-mentioned first logic value is set to "1", therefore the second logic value is set to "0".

Figure 6:
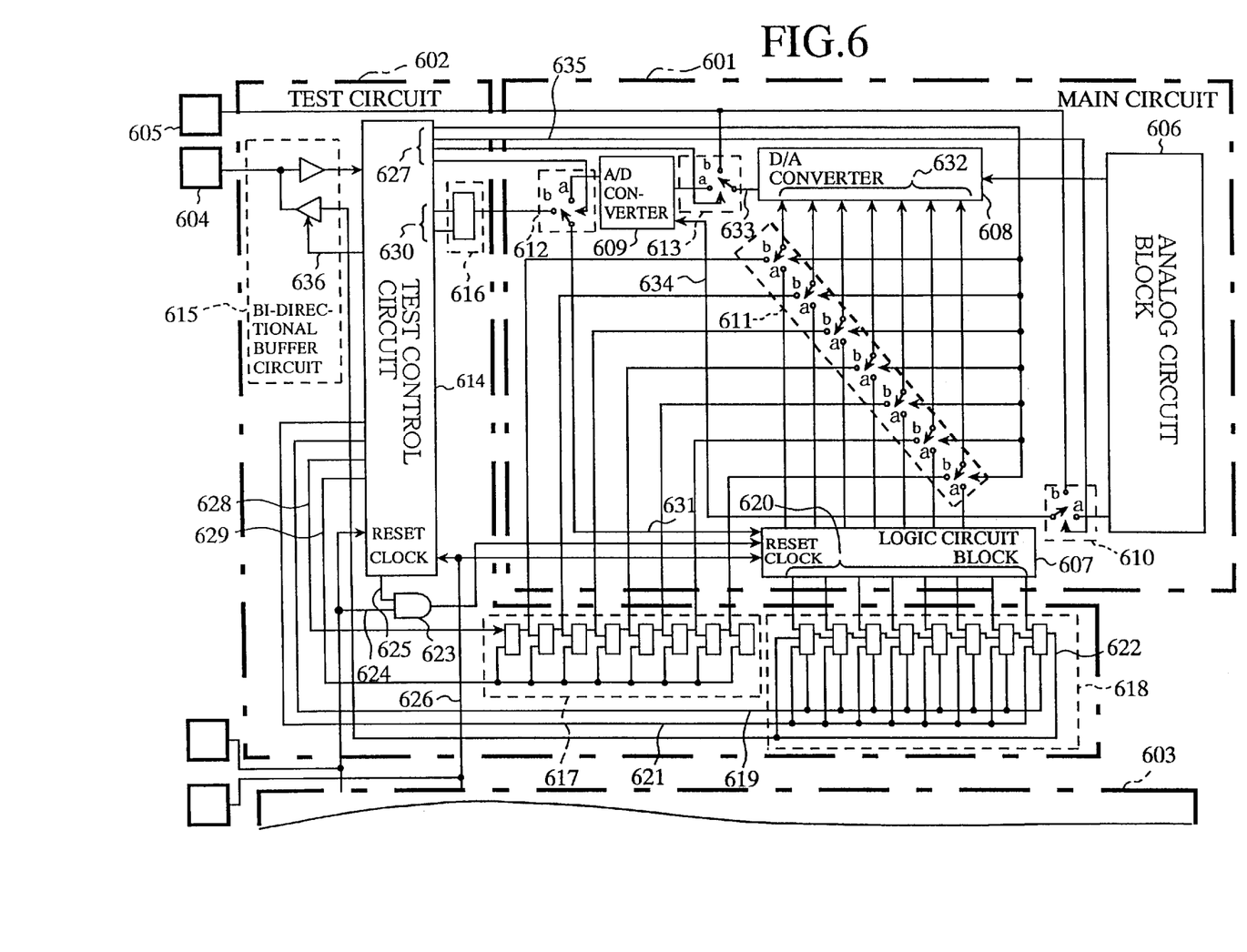
FIG. 6 is a circuit diagram showing an example of a circuit organization according to the first embodiment.

FIG. 6 is a circuit diagram showing this circuit arrangement. In this figure, reference numeral 601 denotes a main circuit to be tested corresponding to the main circuit 102 in FIG. 1, 602 illustrates a test circuit corresponding to the test circuit 103 in FIG. 1, 603 shows another circuit not to be tested corresponding to the circuit 104 in FIG. 1, 604 represents a bi-directional digital test pin corresponding to the bi-directional digital test pin 130 in FIG. 1, 605 indicates an analog test pin corresponding to the analog test pin 131 in FIG. 1.

Reference numeral 606 denotes an analog circuit block formed of analog circuits for processing the analog signals, 607 is a logic bloc including logic circuits, 608 illustrates a D-A converter for converting a digital signal into an analog signal, 609 illustrates an A-D converter for converting an analog signal into a digital signal, and the analog block 606, the logic block 607, the D-A converter 608, and A-D converter 609 comprise the test module 105 in FIG. 1.

Reference numeral 610 denotes an analog switch corresponding to the analog switch 107 in FIG. 1, 611 and 612 illustrate digital switches corresponding to the digital switches 106 in FIG. 1, 613 shows an analog switch corresponding to the analog switch 109 in FIG. 1, and these switches are also included in the main circuit 601.

Reference numeral 614 represents a test control circuit corresponding to the test control circuit 133 in FIG. 1, 615 indicates a bi-directional buffer circuit corresponding to the bi-directional buffer circuit 134 in FIG. 1, 616 and 617 denote registers corresponding to the register 136a, which comprise standard D-type flip-flops, 618 illustrates a register corresponding to the register 137a in FIG. 1, which comprises scan D-type flip-flops, 619 shows a control signal line for the register 618, 620 represents signal lines for transferring data of the register 618 to the logic block 607, 621 indicates a signal line for transferring a clock signal to the register 618 from the test control circuit 614, 622 denotes a signal line for transferring the output signal from the scan D-type flip-flop located at the leftmost to the bi-directional buffer circuit 615, the D-type flip-flop of the register 618 is made active by rising edge of the clock signal, to determine that the output signal from the logic circuit 607 on the signal lines 620 is received or the output from the previous flip-flop is received.

Reference numeral 623 denotes an AND circuit corresponding to the AND circuit 138 in FIG. 1, 624 illustrates a signal line for inputting the reset signal from the outside, and is corresponding to the signal line 125 in FIG. 1, 625 shows a signal line corresponding to the signal line 140 in FIG. 1, and is for transmitting the reset signal from the test control circuit 614 to the AND circuit 623. Note that the clock signal is not required to stop in this circuit arrangement, so that there is no signal line corresponding to the signal lines 126 and 141, and no AND circuit corresponding to the AND circuit 139.

Reference numeral 626 denotes a signal line for transferring the clock signal to supply the same clock signal to the test control circuit 614 and the logic circuit block 607. Reference numeral 627 shows signal lines corresponding to the signal lines 124a to 124c in FIG. 1, for transferring the control signal to control the change of the switches. Reference numeral 628 is a signal line corresponding to the signal line 519 in FIG. 5, for transferring the data to the register 617. Reference numeral 629 illustrates a signal line corresponding to one of the signal lines 525 in FIG. 5, for supplying the clock signal to the register 617. Reference numeral 630 is signal lines for transferring the data and the clock signal to the register 616. The test circuit 602 is composed of the bi-directional buffer circuit 615, the test control circuit 614, the registers 616, 617 and 618, the AND circuit 623 and the signal lines.

Reference numeral 631 represents a signal line for connecting the common terminal of the switch 612 and the logic circuit block 607, 632 denotes signal lines for connecting the common terminal of the switch 611 and the input terminal of the D-A converter 608, 633 illustrates a signal line for connecting the common terminal of the switch 613 and the output terminal of the D-A converter 608, 634 shows a signal line for connecting the common terminal of the switch 610 and the input terminal of the A-D converter 609, 635 indicates a signal line for transferring the control signal to control the operations of the switch 610, and 636 is a signal line for transferring a buffer control signal to switch the direction of the signal transmission of the bi-directional buffer circuit 615.

Next, the operations will be described.

The digital switches 611 and 612 and the analog switch 610 have been inserted into the control nodes of the main circuit 601 so that four different tests can be carried out. In addition, the analog switch 613 has been inserted into the observation node which outputs the data of the D-A converter 608. When the main circuit 601 carries out the normal operation, all switches 610 to 614 are connected to "a" terminal point. This is the state which exists after the integrated circuit device is reset by the reset signal applied onto the signal line 624.

The first test is for the logic circuit block 607, and uses only one digital signal. In this test, the signal line 631 functions as the control node, and the signal line 620 functions as the observation node. The test is carried out by resetting the main circuit 601 at first in accordance with the reset signal on the signal line 625. Subsequently, the switch 612 is turned into a "b" state to output the data of the register 616 to the control node (signal line 631) of the logic circuit block 607. The data from the tester is inputted into the register 616 before the switch 612 is turned into the "b" state, and is also inputted after the switch 612 is turned into the "b" state. Once the control data is transferred to the logic circuit block 607 from the register 616, the observation data is outputted to the signal line 620 from the logic circuit block 607, and is latched to the register 618. Then the control signal on the signal line 619 controls the register 618 such that the observation data latched in the register 618 is outputted to the signal line 622, and the output data on the signal line 622 is inputted into the tester via the bi-directional buffer circuit 615 and the bi-directional digital test pin 604. The basic operations for this test must include: (1) an operation for switching the switch 612 into the "a" state; (2) an operation for inputting the control data into the register 616; (3) an operation for outputting the observation data from the register 618; and (4) an operation for inputting the reset signal into the signal line 625.

The second test is for the D-A converter 608. In this test, the signal line 632 functions as the control node, and the signal line 633 functions as the observation nodes. This test requires input of digital control data and the measuring an analog observation data. The test for the D-A converter 608 is started by firstly switching the digital switch 611 into "b" state side. Then the control data is inputted into the register 617 via the bi-directional digital test pin 604, the bi-directional buffer circuit 615, the test control circuit 614, and the signal line 628. Subsequently, the switch 613 is turned into the "b" state by the control signal outputted onto the signal line 627, and the analog signal is outputted onto the observation node (signal line 633) from the D-A converter, thereby outputting to the tester through the switch 613 and the analog test pin 605. After the observation data has been obtained, the switches 611 and 613 are again returned to the "a" state. The basic operations for this test must include: (1) an operation for switching the switches 611 and 613 into "b" state; (2) an operation for inputting the control data into the register 617; and (3) an operation for returning the switches 611 and 613 to the "a" state.

The third test is for the A-D converter 609. In this test, the signal line 634 functions as an analog control node, and the signal line 620 functions as an observation node. This test is for a group of modules formed by the A-D converter 609 and the logic circuit 607 actually. To execute the test, the main circuit 102 is firstly reset with the reset signal being assumed low on the signal line 625 by the test control circuit 614. Then the switch 610 is turned into "b" state, and the analog control signal is inputted into the A-D converter 609 via the analog test pin 605, the switch 610 and the analog control node (signal line 634) from the tester. After executing the test by this analog control signal, the observation data then comes out on the observation node (signal line 620) via the switch 612, signal line 631, and the logic circuit block 607. This observation data is inputted into the tester through the register 618, signal line 622, the bi-directional buffer circuit 615, and the bi-directional digital test pin 604 to execute the test. The test for the A-D converter 609 is concluded by returning the analog switch 610 to the "a" state. The basic operations of this test must include: (1) an operation for switching the switch 610 to "b" state; (2) an operation for outputting the observation data from the register 618; (3) an operation for returning the switch 610 to the "a" state; and (4) an operation for outputting the reset signal onto the signal line 625.

The final test is a complete test which has observation nodes on the signal line 620, and no control node. The normal operation of the main circuit 601 is completely tested in this test. First, this test is executed by resetting all circuit of the integrated circuit device after which normal operation data is allowed to propagate to the main circuit 601. After a predetermined time interval, the output signal on the signal line 620 is latched into the register 618, and inputted into the tester through the signal line 620, the bi-directional buffer circuit 615, and the bi-directional digital test pin 604. The basic operations for this complete test must include: (1) an operation for outputting the reset signal onto the signal line 625; and (2) an operation for outputting the observation data from the register 618.

Figure 7:
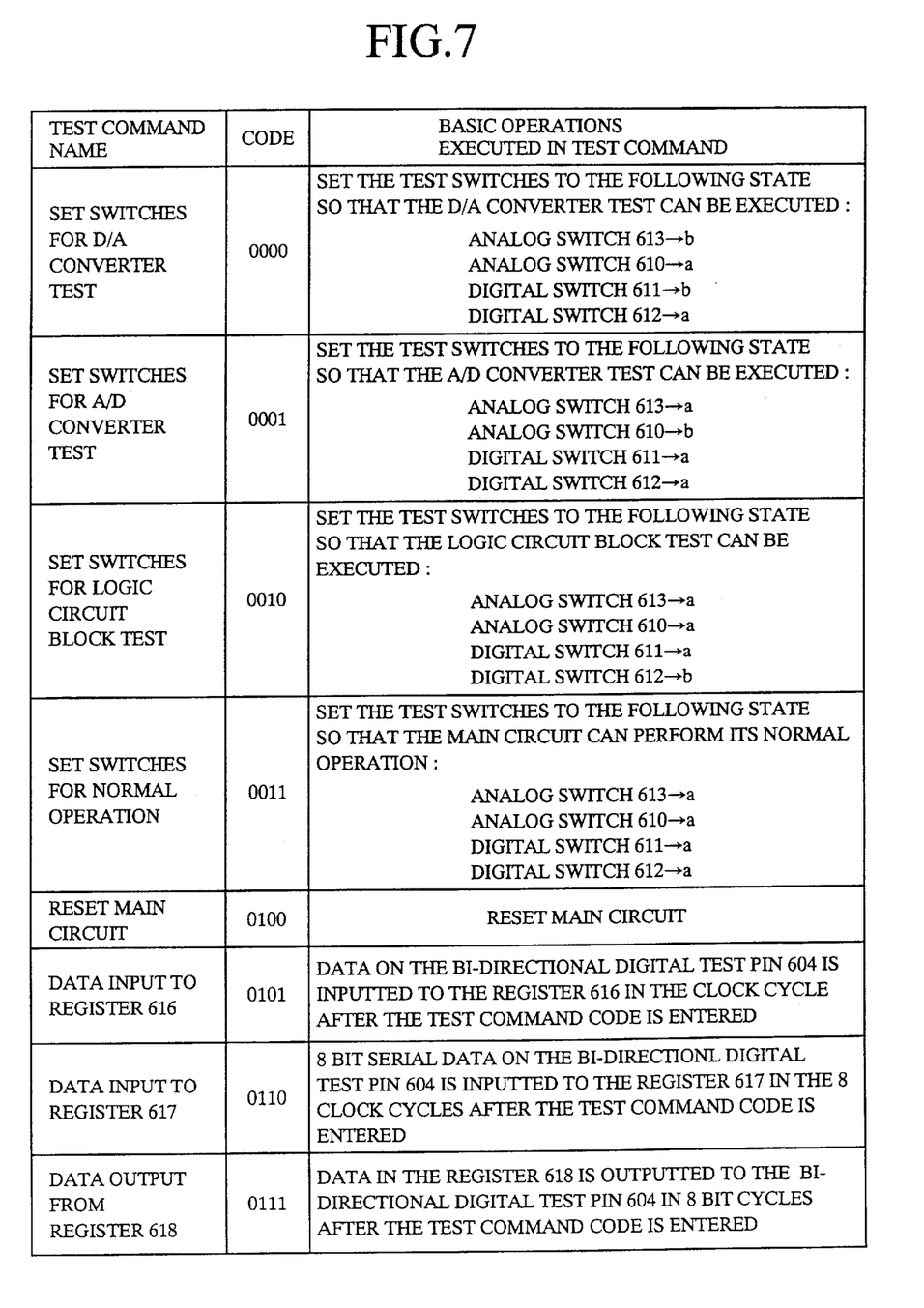
FIG. 7 is a chart which summarizes test commands for executing the main circuit test for the example circuit of FIG. 6, and the contents of the basic operation executed by the test commands.

FIG. 7 is a diagram showing the commands to execute the test and the contents of a basic operation executed by them. Note that basic operations other than in FIG. 7 can be executed by each test command.

In this circuit arrangement, since there are eight basic operations, log 28=3 bits are required to identify the basic operations unambiguously. A fourth bit of the second logic value "0" is required to mark the start of the basic operation, so that the total length of the test command codes is four bits.

Figure 8:
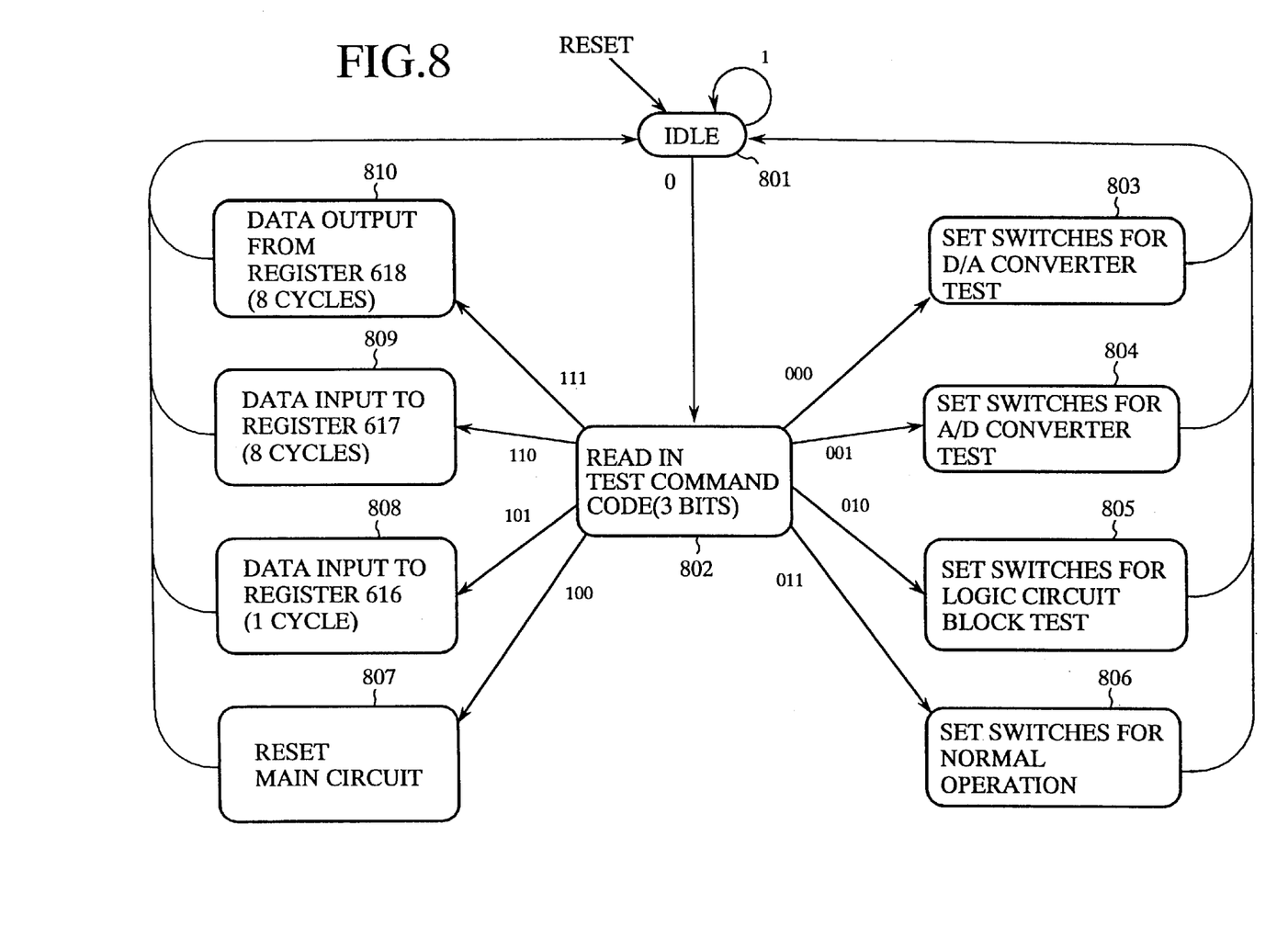
FIG. 8 is a transition diagram of a test control circuit for the example circuit of FIG. 6.

The state transition diagram of the test control circuit 614 used in the example of the this circuit arrangement is shown in FIG. 8. This circuit arrangement example starts in the idle state 801 after reset. While in the idle state, the bi-directional digital test pin 604 functions as an input pin, and the circuit arrangement example stays in the idle state as long as the input data applied into the bi-directional test pin 604 is the logic value "1". Once the data having the logic value "0" has been inputted into the bi-directional test pin 604, the test control circuit 614 realizes that a test command code is transferred, and the circuit arrangement example makes a transition to the read state 802 of the test command code.

In the following three cycles, the test control circuit 614 reads in three data inputted from the bi-directional digital test pin 604, to uniquely identify one of the eight test commands. In the case that the read code is "000", "001", "010", "011" or "100", the setting of the corresponding switch respectively shown in the states 803 to 807 or resetting of the main circuit 601 will be executed after these codes are received. Once these operations are completed, the test control circuit 614 returns to the idle state 801.

If the test command code "101" is chosen, the test control circuit transitions to the state 808, and the data on the bi-directional digital test pin 604 is inputted into the register 616 in synchronization with the rising of the following clock signal. If the test command code "110" is chosen, the test control circuit transitions to the state 809, and the data on the bi-directional test pin 604 is read in the register 617 in the following eight clock cycles. If the test command code "111" is chosen, the bi-directional digital test pin is switched into the output mode, and it makes the transition to the state 810, to output the data in the register 618 from the bi-directional digital test pin 604 in the following eight clock cycles. Once these operations are terminated, the test control circuit 614 returns to the idle state 801, and the bi-directional digital test pin 604 functions as the input mode.

Figure 9:
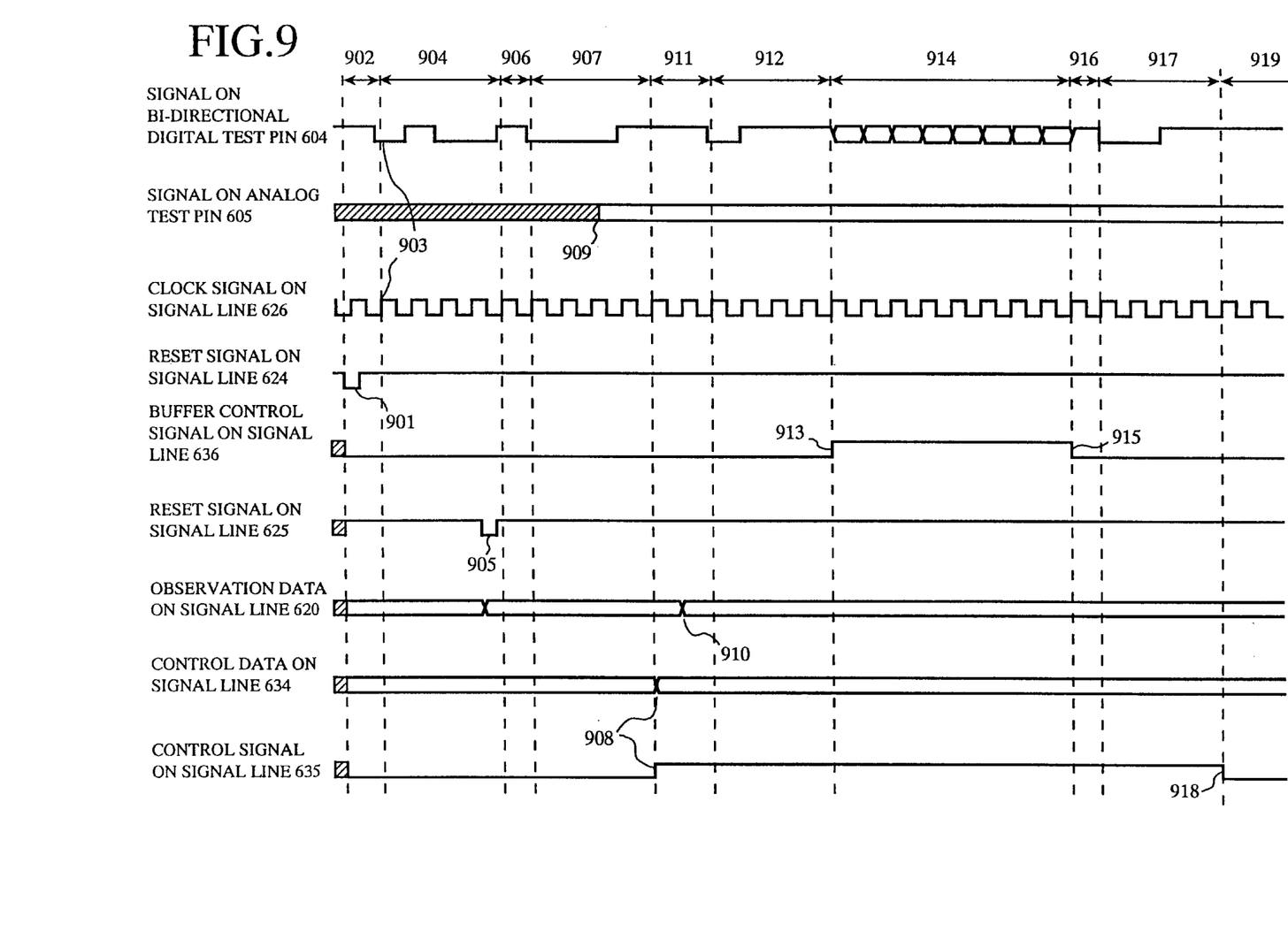
FIG. 9 is a timing chart of relevant signals of a test operation in an AD converter for the example circuit of FIG. 6.

FIG. 9 is a timing chart for the related signal for the test operations of the A-D converter, in the operations of the circuit arrangement example. In the figure, a reference numeral 901 denotes an asynchronous reset signal for putting the test control circuit 614 in the idle state, and for putting the main circuit 601 into resetting. During the time interval 902, the test control circuit 614 is in the idle state. At the clock rising edge of the signal line 626 at time 903, the test control circuit 614 reads the signal of the logic value "0" from the bi-directional digital test pin 604, and puts into the read state of the test command code where it remains for the next three clock cycles. In other words, the test control circuit 614 identifies the test command code for the four clock cycles. During a time interval 904, a sequence of the logic value "0100" is inputted from the bi-directional test pin 604. This logic value sequence "0100" is identified as a reset signal for the main circuit, and the reset of the main circuit 601 is executed asynchronously by the reset signal 905 outputted onto the signal line 625. Note that the a synchronous reset can also be used. Upon completing this basic operations, the test control circuit 614 returns to the idle state, and the digital test pin 604 is driven high in the next time period 906.

During a time interval 907, the test command code "0001" which indicates the switch setting for testing the A-D converter 609 is inputted onto the bi-directional digital test pin 604 from the tester, and the switches shown in the second column of FIG. 7 are set on the rising edge of the following clock signal, thereby causing the control data on the analog test pin 605 to input from the signal line 634 to the A-D converter 609 at time 908. Note that this control data has already supplied to the analog test pin 605 from the tester at time 909. The measured data which indicates the control result of this control data is outputted onto the signal line 620 from the logic circuit block 607 at time 910. Note that the test control circuit 614 is in the idle state during the time period 911 including the time 910 where the measured data is outputted.

During the next time period 911, the test command code "0111" which instructs the data output from the register 618 is inputted onto the bi-directional digital test pin 604. If this test command is inputted, the test control circuit 614 then causes the buffer control signal on the signal line 636 to go high at time 913, and the bi-directional digital test pin 604 is turned to the output mode. During the next time interval 914 having eight cycles, the measured data which is held in the register 618 is outputted to the bi-directional digital test pin 604, and is sampled by the tester. After completed the output of this measured data, the bi-directional digital test pin 604 is returned to the input mode.

During the next time period 916, the test control circuit 614 is again in the idle state. Then the test command code "0011" is inputted to the bi-directional digital test pin 604 at time 917, and the test control circuit 614 turns the switches shown in fourth column of FIG. 7 at time 918 to make normal operation. After this, during the time interval 919, the test control circuit 614 returns to the idle state. Therefore, the test of the A-D converter 609 is terminated. In addition, the other test timing is the same as the timing shown in FIG. 9.

As mentioned above, according to the first embodiment, there are advantages that the digital circuit part of the main circuit 102 or 601 can be tested by using only one bi-directional digital test pin 130 or 640, and the analog circuit part can be tested.

EMBODIMENT 2

In the first embodiment, although the digital circuit part and the analog circuit part are respectively tested using the bi-directional digital test pin 130 or 604 and the analog test pin 131 or 605, the second embodiment includes a test pin which functions as both the digital bi-directional test pin and the analog test pin. Whether the test pin functions as the digital bi-directional test pin or the analog test pin will be determined by the state of the test control circuit. In the second embodiment, the time allotted for inputting/outputting or measuring the analog signal on the test pin is predetermined, so that the test pin is switched into the digital signal test after the analog signal test is concluded.

Figure 10:
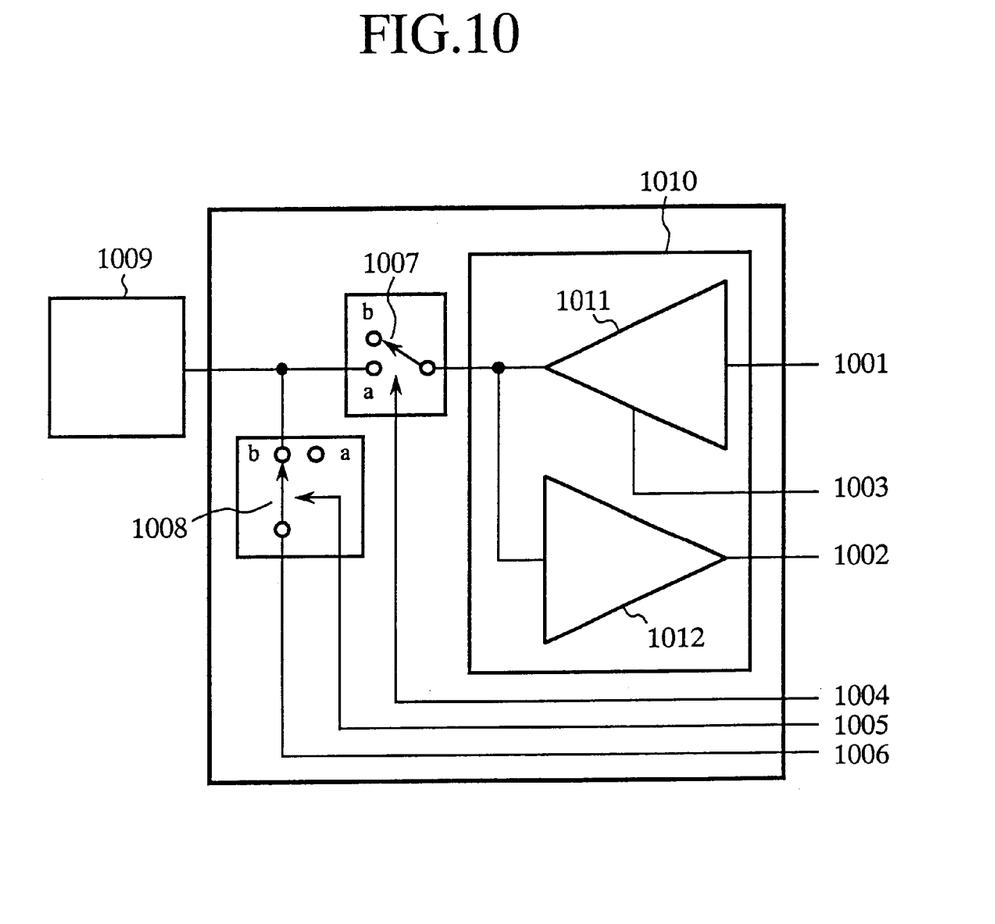
FIG. 10 is a circuit diagram showing the feature of a buffer part for the integrated circuit device of a second embodiment of the present invention.

FIG. 10 is a circuit diagram showing the structure of the buffer part (corresponding to the bi-directional buffer circuit of the integrated circuit device 101 shown in FIG. 1) of the integrated circuit device according to the second embodiment of the present invention. In the figure, reference numeral 1001 denotes a digital data output port for outputting the digital data of the main circuit to the tester, 1002 illustrates a digital data input port for inputting the digital data into the main circuit from the tester, 1003 shows a signal line for transferring a control signal to switch the input and output operations of this buffer part, 1004 and 1005 represent signal lines for transferring a control signal instructing the switching operation of the test switch from the test control circuit, 1006 indicates an analog test signal port which is connected to the analog control node and/or the analog observation node, and 1007 denotes an analog switch which passes the digital signal through and enters the open state when measuring the analog circuit part. Reference numeral 1008 is an analog switch, 1009 illustrates a test pin for dealing the test signal and the data with the tester, 1010 shows a digital bi-directional buffer circuit, 1011 represents a tristate buffer circuit, and 1012 indicates a normal buffer circuit. In addition, except for this buffer part feature, its accompanying some connections and the control signal at the buffer part, the other feature of the second embodiment is the same as the feature of the first embodiment, so that the relevant explanation is omitted.

Next, the description will be made the operation of the second embodiment.

When the test pin 1009 is used as the analog test pin, the buffer part operates as follows. First, the test control circuit is in the idle state causing the buffer to function as a digital input mode with both analog switches 1007 and 1008 being in the "a" state. Owing to this, the analog test signal port 1006 is disconnected from the test pin 1009, and the digital bi-directional buffer circuit 1010 is connected to the test pin 1009. After the test command codes for inputting and outputting the analog signal via the test pin 1009, the analog switch 1007, the buffer circuit 1012, and the digital data port 1002 are inputted into the test module, the analog switches 1007 and 1008 are changed to the "b" state, so that the digital bi-directional buffer circuit 101 is disconnected from the test pin 1009, whereby the analog test signal port 1006 is connected to the test pin 1009 via the analog switch 1008. Accordingly, the analog control data can be inputted into the test module, or the analog observation data can be outputted from the test module. After the counter in the test control circuit counts the predetermined time required for processing the analog signal by the tester, the analog switches 1007 and 1008 are again returned to the "a" state, and allowing the digital circuit part to be tested.

As described above, according to the second embodiment, there is an advantage that the test for the digital circuit part and the analog circuit part of the test module can be tested using only one test pin.

The preferred embodiments of the present invention were described above, but the descriptions are only for illustrations, and it should be interpreted so that deformations and changes of the above descriptions may be performed without departing from the spirits and the scopes of the following claims.

What is claimed is:

1. An integrated circuit device comprising:
 a main circuit including a digital circuit for digital signal processing;
 a test circuit for transferring control data from an external tester to said main circuit to test performance of said digital circuit, and for outputting observation data from said main circuit to the external tester based on the control data; and
 a single bi-directional digital test pin for transferring the control data and the observation data between said test circuit and the external tester.

2. The integrated circuit device according to claim 1, wherein
 said main circuit includes an analog circuit for analog signal processing,
 said test circuit transfers control data for testing performance of said analog circuit from the external tester to said main circuit, and
 said integrated circuit device further comprises an analog test pin for exchanging control data and observation data of said analog circuit with the external tester.

3. An integrated circuit device comprising:
 a main circuit including a digital circuit for digital signal processing and an analog circuit for analog signal processing;
 a test circuit for transferring control data from an external tester to said main circuit to test performance of said digital circuit and said analog circuit, and for outputting observation data from said main circuit to the external tester, and
 a single test pin for transferring the control data and the observation data between said test circuit and the external tester.

4. A method for testing an integrated circuit device including a main circuit having a digital circuit for digital signal processing, and a switch switching to a performance test state connecting the digital circuit to receive control data, and a test circuit for transferring the control data from an external tester, through the switch, and to the digital circuit of the main circuit to test performance of the digital circuit, the test circuit outputting observation data from the digital circuit of the main circuit through a test pin of the integrated circuit device to the tester based on the control data, the method comprising:
 switching the switch into the performance test state;
 transferring the control data serially from the external tester to the test circuit through the test pin of the integrated circuit device; and
 outputting the observation data from the test circuit to the external tester through the test pin.

5. A method for testing an integrated circuit device including a main circuit having an analog circuit for analog signal processing, and a switch switching to a performance test state connecting the analog circuit to receive control data, and a test circuit for transferring the control data to test performance of the analog circuit from an external tester, through the switch, and to the analog circuit of the main circuit, the test circuit outputting observation data through an analog test pin of the integrated circuit device to the external tester based on the control data, the test method comprising:

switching the switch into the performance test state;

transferring the control data from the external tester to the test circuit through the analog test pin of the integrated circuit device; and outputting the observation data from the test circuit to the external tester through the analog test pin.

* * * * *